United States Patent
Yin et al.

(10) Patent No.: US 7,994,611 B1
(45) Date of Patent: Aug. 9, 2011

(54) BIPOLAR TRANSISTOR FABRICATED IN A BICMOS PROCESS

(75) Inventors: Kevin Q. Yin, Irvine, CA (US); Amol Kalburge, Irvine, CA (US); Kenneth M. Ring, Tustin, CA (US)

(73) Assignee: Newport Fab, LLC, Newport Beach, CA (US)

( * ) Notice: Subject to any disclaimer, the term of this patent is extended or adjusted under 35 U.S.C. 154(b) by 0 days.

(21) Appl. No.: 10/892,015

(22) Filed: Jul. 14, 2004

Related U.S. Application Data

(62) Division of application No. 10/371,706, filed on Feb. 21, 2003, now Pat. No. 6,797,580.

(51) Int. Cl.
*H01L 29/73* (2006.01)
(52) U.S. Cl. .......... 257/588; 257/E29.114; 257/E29.174
(58) Field of Classification Search .................. 257/198, 257/370, 587, 588, 591, E21.371, E29.03, 257/E27.053, E29.114, E29.174, 197; 438/202, 438/309, 235, 312, 343
See application file for complete search history.

(56) References Cited

U.S. PATENT DOCUMENTS

| | | | |
|---|---|---|---|
| 4,855,244 A * | 8/1989 | Hutter et al. | 438/203 |
| 6,114,746 A * | 9/2000 | Leonardi et al. | 257/592 |
| 6,384,469 B1 * | 5/2002 | Chantre | 257/565 |
| 6,468,871 B1 * | 10/2002 | Naem | 438/378 |
| 6,638,819 B1 * | 10/2003 | Joshi et al. | 438/256 |
| 6,680,235 B1 * | 1/2004 | U'Ren et al. | 438/309 |
| 2002/0132435 A1 * | 9/2002 | Zampardi et al. | 438/312 |
| 2002/0197807 A1 * | 12/2002 | Jagannathan et al. | 438/312 |
| 2003/0096486 A1 * | 5/2003 | Chuang et al. | 438/309 |
| 2004/0135179 A1 * | 7/2004 | Kalburge et al. | 257/273 |

* cited by examiner

*Primary Examiner* — Colleen A Matthews
(74) *Attorney, Agent, or Firm* — Farjami & Farjami LLP

(57) ABSTRACT

According to one exemplary embodiment, a bipolar transistor includes a base having a top surface. The bipolar transistor further includes a base oxide layer situated on the top surface of the base. The bipolar transistor further includes an antireflective coating layer situated on the base oxide layer. The bipolar transistor further includes an emitter situated over the top surface of the base and the antireflective coating layer, where a layer of polysilicon is not situated between the base oxide layer and the emitter.

10 Claims, 5 Drawing Sheets

BIPOLAR TRANSISTOR FABRICATED IN A BICMOS PROCESS

This is a divisional of application Ser. No. 10/371,706 filed Feb. 21, 2003.

BACKGROUND OF THE INVENTION

1. Field of the Invention

The present invention is generally in the field of fabrication of semiconductor devices. More specifically, the invention is in the field of fabrication of bipolar transistors.

2. Background Art

Bipolar transistors can be integrated with CMOS transistors on the same die to provide circuits that combine the advantages of high speed and high frequency provided by bipolar transistors with the advantages of low power consumption and high noise immunity typically provided by CMOS transistors. For example, an NPN silicon-germanium ("SiGe") heterojunction bipolar transistor, used as an example in the present application, and a CMOS transistor, such as a PFET, can be fabricated on the same substrate of a semiconductor die using a Bipolar Complementary-Metal-Oxide-Semiconductor ("BiCMOS") process.

However, the process flow utilized to fabricate bipolar transistors in a bipolar region of a substrate can undesirably affect fabrication of CMOS transistors in a CMOS region of the substrate. As a result, manufacturing yield can undesirably decrease, which causes a corresponding increase in manufacturing cost. Thus, semiconductor manufacturers are challenged to provide a process for fabricating bipolar transistors in a bipolar region of a substrate that does not undesirably affect CMOS devices in a CMOS region of the substrate.

In one known technique utilizing a "polysilicon process flow," an emitter window stack is formed over a SiGe base layer in bipolar and CMOS regions of a substrate. The emitter window stack includes a thin base oxide layer, an antireflective coating ("ARC") layer, and a layer of amorphous polysilicon ("poly"), which are sequentially deposited over the SiGe base layer. After patterning and etching an emitter window in the emitter window stack in the bipolar region of the substrate, a layer of emitter poly is deposited in the emitter window opening and over the SiGe base layer. An emitter is then formed in an emitter poly etch process, which requires selective removal of the emitter poly layer, ARC layer, amorphous poly layer, and thin base oxide layer in the bipolar and CMOS regions of the substrate. The selective removal of the amorphous poly layer, in addition to removal of the other layers discussed above, undesirably increases complexity of the emitter poly etch process.

Although the "poly process flow" discussed above achieves desirable control of emitter window critical dimension, the poly process flow is a complex process that requires removal of multiple layers in bipolar and CMOS regions of the substrate. Furthermore, the poly process flow requires fabrication of an additional poly layer, i.e. an amorphous poly layer, which undesirably increases overall processing time. Additionally, the poly process flow causes defects, such as pitting and poly stringer formation, in CMOS region of the substrate, which reduce manufacturing yield and increase manufacturing cost.

Thus, there is need in the art for a method for fabricating bipolar transistors in a BiCMOS process that provides reduced process complexity and manufacturing cost.

SUMMARY OF THE INVENTION

The present invention is directed to method for fabricating a bipolar transistor in a BiCMOS process and related structure. The present invention addresses and resolves the need in the art for a method for fabricating bipolar transistors in a BiCMOS process that provides reduced process complexity and manufacturing cost.

According to one exemplary embodiment, a method for fabricating a bipolar transistor in a BiCMOS process comprises a step of forming an emitter window stack by sequentially depositing a base oxide layer and an antireflective coating layer on a top surface of a base, where the emitter window stack does not comprise a polysilicon layer. The bipolar transistor may be, for example, an NPN silicon-germanium heterojunction bipolar transistor. The base oxide layer may be, for example, USG oxide. The method next comprises etching an emitter window opening in the emitter window stack.

The method further comprises depositing an emitter layer is deposited in the emitter window opening and over the antireflective coating layer. According to this exemplary embodiment, the method further comprises etching the emitter layer to form an emitter. The method further comprises etching a first portion of the base oxide layer not covered by the emitter using a first etchant so as to cause the first portion of the base oxide layer to have a thickness less than a thickness of a second portion of the base oxide layer covered by the emitter.

In one embodiment, the invention is a bipolar transistor fabricated by utilizing the above discussed method. Other features and advantages of the present invention will become more readily apparent to those of ordinary skill in the art after reviewing the following detailed description and accompanying drawings.

DETAILED DESCRIPTION OF THE INVENTION

The present invention is directed to method for fabricating a bipolar transistor in a BiCMOS process and related structure. The following description contains specific information pertaining to the implementation of the present invention. One skilled in the art will recognize that the present invention may be implemented in a manner different from that specifically discussed in the present application. Moreover, some of the specific details of the invention are not discussed in order to not obscure the invention. The specific details not described in the present application are within the knowledge of a person of ordinary skill in the art.

The drawings in the present application and their accompanying detailed description are directed to merely exemplary embodiments of the invention. To maintain brevity, other embodiments of the invention which use the principles of the present invention are not specifically described in the present application and are not specifically illustrated by the present drawings.

Figure 1:
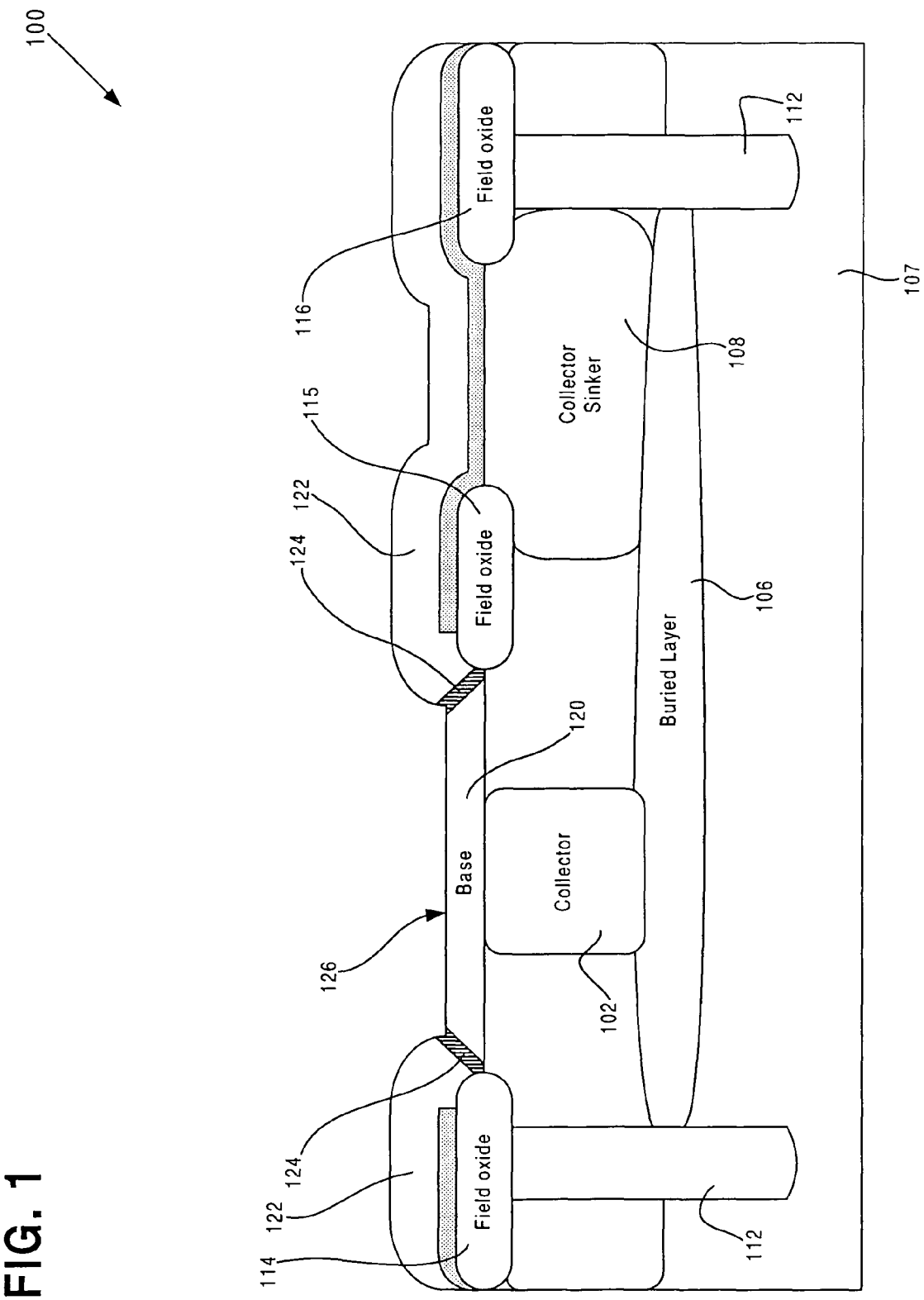
FIG. 1 illustrates a cross-sectional view of some of the features of an exemplary bipolar transistor prior to application of the steps taken to implement an embodiment of the present invention.

FIG. 1 shows exemplary structure 100, which is utilized to describe the present invention. Certain details and features have been left out of FIG. 1, which are apparent to a person of ordinary skill in the art. Structure 100 includes collector 102 and base 120 for a bipolar transistor. The present invention applies, in general, to any bipolar transistor, including a heterojunction bipolar transistor ("HBT"). For example, the present invention applies to NPN or PNP HBTs comprising silicon, silicon-germanium, gallium-arsenide, or other materials. However, the present application makes specific reference to a silicon-germanium ("SiGe") NPN bipolar transistor as an aid to describe an embodiment of the present invention. In the present embodiment, collector 102 is N type single crystal silicon that can be formed using a dopant diffusion process in a manner known in the art. In the present embodiment, base 120 is P type SiGe single crystal that might be deposited epitaxially in a low-pressure chemical vapor deposition ("LPCVD") process. Base 120 may be implanted with boron ions to achieve the aforementioned P type doping. As seen in FIG. 1, base 120 is situated on top of, and forms a junction with, collector 102. In the present embodiment, base contact 122 is polycrystalline SiGe that may be deposited epitaxially in a LPCVD process. Base 120 and base contact 122 connect with each other at interface 124 between the contact polycrystalline material and the base single crystal material. Base 120 has a top surface 126.

As seen in FIG. 1, buried layer 106, which is composed of N+ type material, i.e. it is relatively heavily doped N type material, is formed in silicon substrate 107 in a manner known in the art. Silicon substrate 107 includes a bipolar region, where a bipolar transistor, which includes base 120 and collector 102, is formed, and a CMOS region (not shown in FIG. 1), where CMOS devices are formed. Collector sinker 108, also comprised of N+ type material, is formed by diffusion of heavily concentrated dopants from the surface of collector sinker 108 down to buried layer 106. Buried layer 106, along with collector sinker 108, provide a low resistance electrical pathway from collector 102 through buried layer 106 and collector sinker 108 to a collector contact (the collector contact is not shown in FIG. 1). Deep trenches 112 and field oxide isolation regions 114, 115, and 116 may be composed of silicon dioxide ($SiO_2$) material and are formed in a manner known in the art. Deep trenches 112 and field oxide isolation regions 114, 115, and 116 provide electrical isolation from other devices on silicon substrate 107 in a manner known in the art. Thus, FIG. 1 shows that structure 100 includes several features and components used to form a bipolar transistor at a stage prior to formation of an emitter comprised of N type polycrystalline silicon above base 120.

Figure 2:
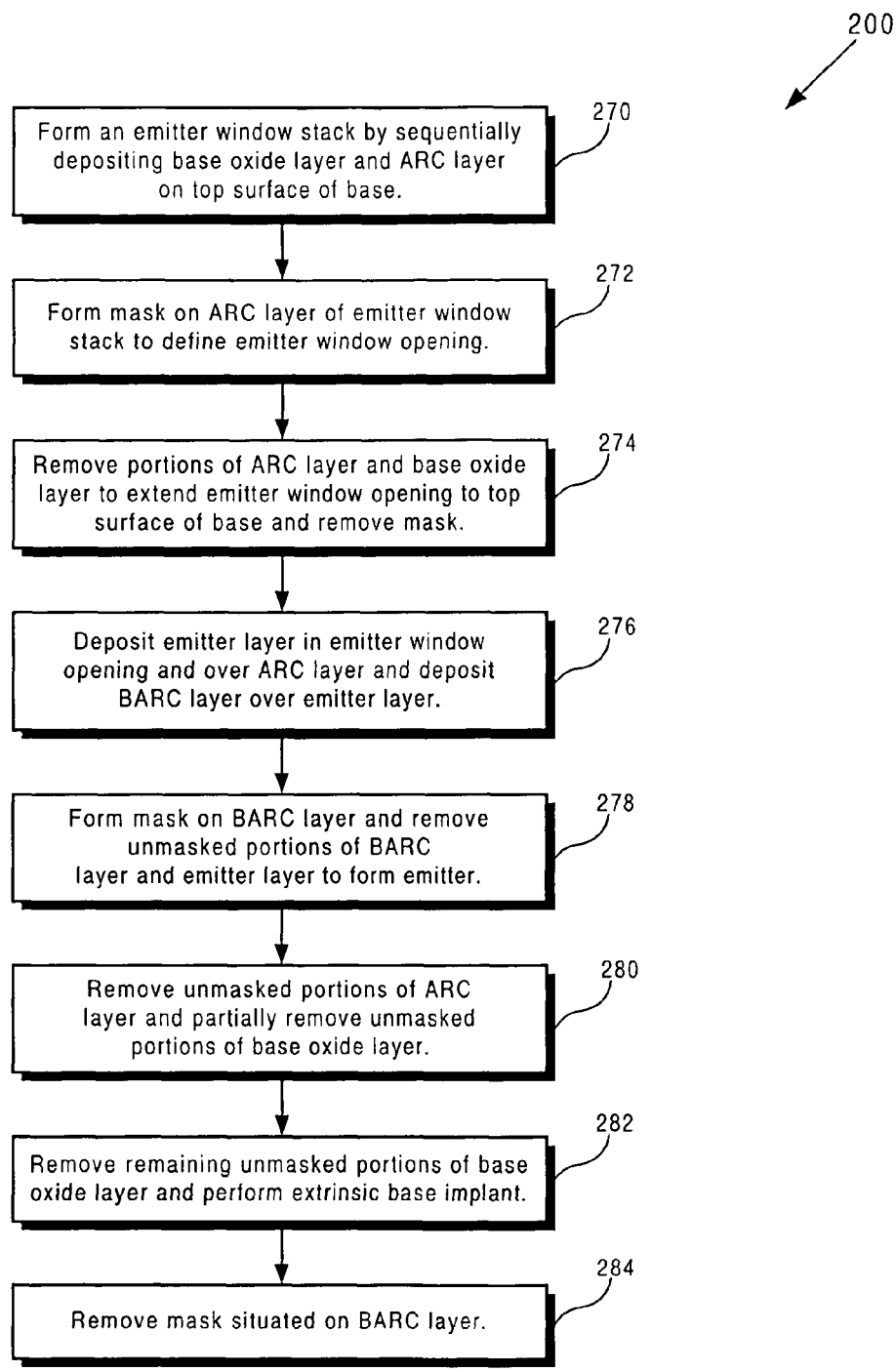
FIG. 2 shows a flowchart illustrating the steps taken to implement an embodiment of the present invention.

FIG. 2 shows flowchart 200, which describes the steps, according to one embodiment of the present invention, in the processing of a wafer that includes structure 100. Certain details and features have been left out of flowchart 200 that are apparent to a person of ordinary skill in the art. For example, a step may consist of one or more substeps or may involve specialized equipment or materials, as known in the art.

While steps 270 through 284 indicated in flowchart 200 are sufficient to describe one embodiment of the present invention, other embodiments of the invention may utilize steps different from those shown in flowchart 200. It is noted that the processing steps shown in flowchart 200 are performed on a wafer, which, prior to step 270, includes structure 100 shown in FIG. 1. In particular, the wafer includes top surface 126 of base 120 on which formation of an emitter comprised of N type polycrystalline silicon is to take place in an "emitter window opening."

Figure 3A:
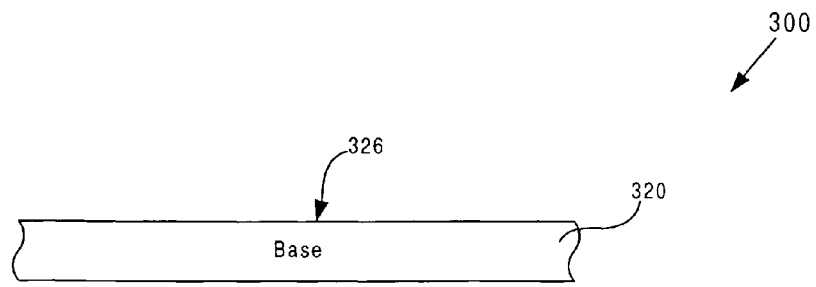
FIG. 3A illustrates a cross-sectional view, which includes a portion of a wafer processed according to an embodiment of the invention.

Referring now to FIG. 3A, structure 300 of FIG. 3A shows a portion of structure 100 of FIG. 1. Base 120 and top surface 126 of structure 100 are shown in structure 300 as base 320 and top surface 326, respectively. For ease of illustration, other features such as base contact 122, interface 124, collector 102, buried layer 106, silicon substrate 107, collector sinker 108, deep trenches 112, and field oxide regions 114, 115, and 116, are not shown in structure 300. Structure 300 thus shows the portion of a wafer including top surface 326 of base 320, on which the formation of an emitter comprised of N type polycrystalline silicon is to take place in an emitter window opening, before processing the wafer according to one embodiment of the invention shown in flowchart 200 of FIG. 2. In particular, structure 300 shows a portion of the wafer before processing step 270 of flowchart 200.

Referring to FIGS. 3B through 3I, structures 370, 372, 374, 376, 378, 380, 382, and 384 illustrate the result of performing, on structure 300, steps 270, 272, 274, 276, 278, 280, 282, and 284 of flowchart 200 of FIG. 2, respectively. For example, structure 370 shows structure 300 after processing step 270, structure 372 shows structure 370 after the processing of step 272, and so forth.

Figure 3B:
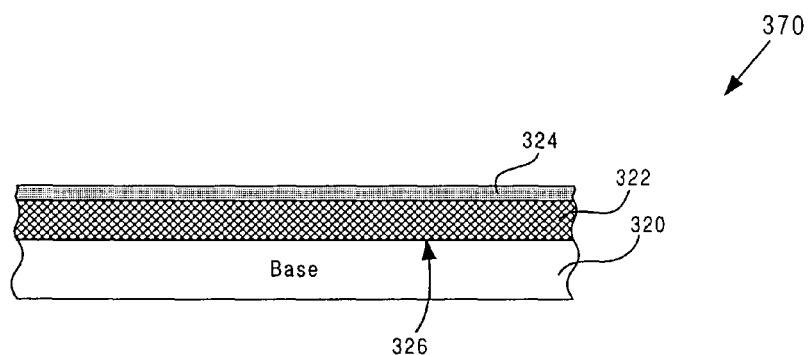
FIG. 3B illustrates a cross-sectional view, which includes a portion of a wafer processed according to an embodiment of the invention, corresponding to step 270 of the flowchart of FIG. 2.

Continuing with step 270 in FIG. 2 and structure 370 in FIG. 3B, step 270 of flowchart 200 comprises forming an emitter window stack by depositing base oxide layer 322 on top surface 326 of base 320 and depositing ARC layer 324 over base oxide layer 322. Base oxide layer 322 can comprise undoped silicate glass ("USG") oxide, which may be deposited by a chemical vapor deposition ("CVD") process or other appropriate process as known in the art. By way of example, base oxide layer 322 can have a thickness of approximately 830.0 Angstroms. However, in another embodiment, base oxide layer 322 may have a different thickness. ARC layer 324 can comprise an inorganic material such as silicon oxynitride, for example. ARC layer 324 provides enhanced photolithographic control over printing of an emitter window opening in a subsequent step by reducing "subsurface reflections," which degrade image definition. By way of example, ARC layer 324 can have a thickness of approximately 310.0 Angstroms. Thus, the present invention provides an emitter window stack comprising only two layers, i.e. base oxide layer 322 and ARC layer 324. The result of step 270 of flowchart 200 is illustrated by structure 370 in FIG. 3B.

Figure 3C:
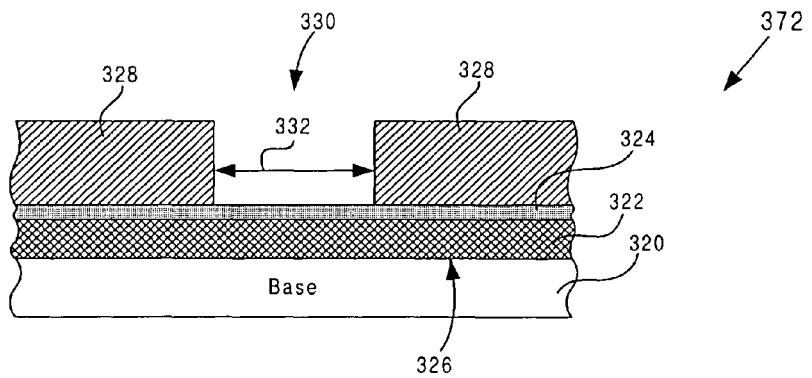
FIG. 3C illustrates a cross-sectional view, which includes a portion of a wafer processed according to an embodiment of the invention, corresponding to step 272 of the flowchart of FIG. 2.

Referring to step 272 in FIG. 2 and structure 372 in FIG. 3C, at step 272 of flowchart 200, mask 328 is formed on ARC layer 324 of the emitter window stack to define emitter window opening 330. Mask 328 can comprise photoresist or other suitable masking material and can be formed, for example, by depositing and patterning a layer of masking material on ARC layer 324. Emitter window opening 330 has width 332, which determines the width of an emitter that will be formed in a subsequent process step. Referring to FIG. 3C, the result of step 272 of flowchart 200 is illustrated by structure 372.

Figure 3D:
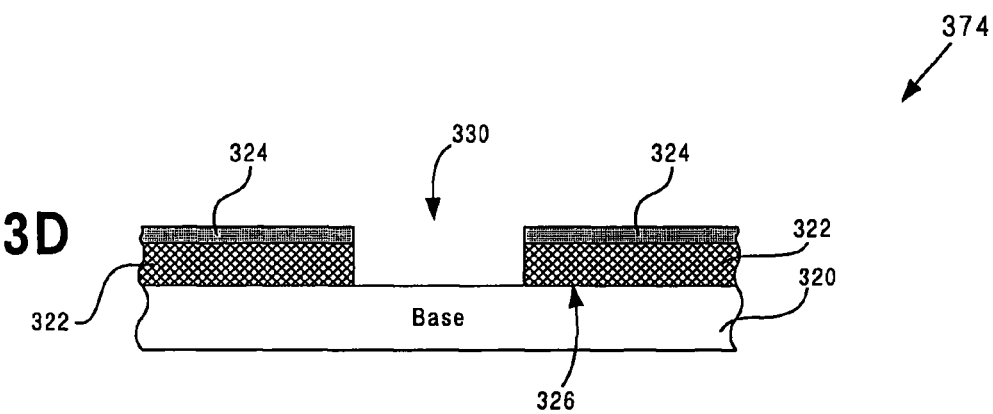
FIG. 3D illustrates a cross-sectional view, which includes a portion of a wafer processed according to an embodiment of the invention, corresponding to step 274 of the flowchart of FIG. 2.

Continuing with step 274 in FIG. 2 and structure 374 in FIG. 3D, at step 274 of flowchart 200, portions of ARC layer 324 and base oxide layer 322 are removed to extend emitter window opening 330 to top surface 326 of base 320 and mask 328 is removed. ARC layer 324 can be removed by using a plasma dry etch, for example. The plasma dry etch has a sufficient degree of etch selectivity to base oxide to allow the plasma dry etch to stop on base oxide layer 322. However, ARC layer 324 is overetched to remove a portion of base oxide layer 322 in emitter window opening 330. The remaining portion of base oxide layer 322 in emitter window opening 330 can be removed utilizing a dilute hydrofluoric acid ("DHF") etchant or a buffered oxide etchant ("BOE") comprising an HF+NH4F chemistry, for example. Mask 328 can be removed in a wet strip process as known in the art. Referring to FIG. 3D, the result of step 274 of flowchart 200 is illustrated by structure 374.

Figure 3E:
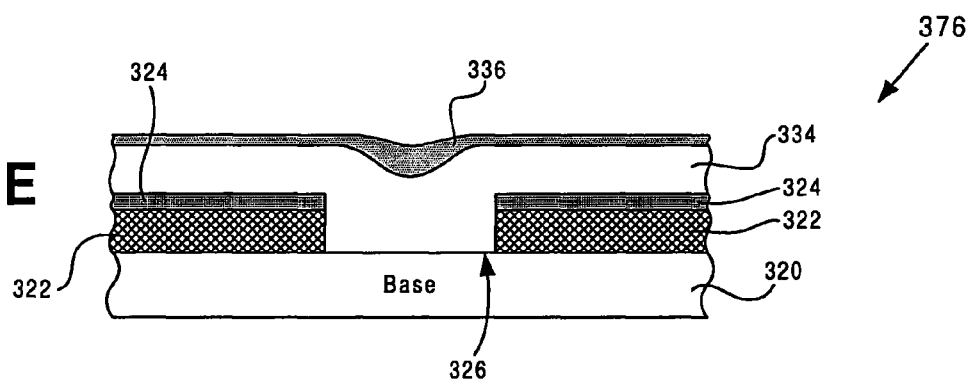
FIG. 3E illustrates a cross-sectional view, which includes a portion of a wafer processed according to an embodiment of the invention, corresponding to step 276 of the flowchart of FIG. 2.

Continuing with step 276 in FIG. 2 and structure 376 in FIG. 3E, at step 276 of flowchart 200, emitter layer 334 is deposited in emitter window opening 330 and over ARC layer 324 and BARC ("bottom antireflective coating") layer 336 is deposited over emitter layer 334. Emitter layer 334 can comprise polycrystalline silicon and may be deposited by a CVD process or other appropriate process. In one embodiment, emitter layer 334 can comprise N type polycrystalline silicon. BARC layer 336 can comprise, for example, an organic BARC material with some dopants, and may be deposited by a spin-on process, an evaporation process, or other appropriate process. BARC layer 336 can provide enhanced photolithographic control during formation of a mask in a subsequent step by reducing unwanted "subsurface reflections" in a manner similar to ARC layer 324. Referring to FIG. 3E, the result of step 276 of flowchart 200 is illustrated by structure 376.

Figure 3F:
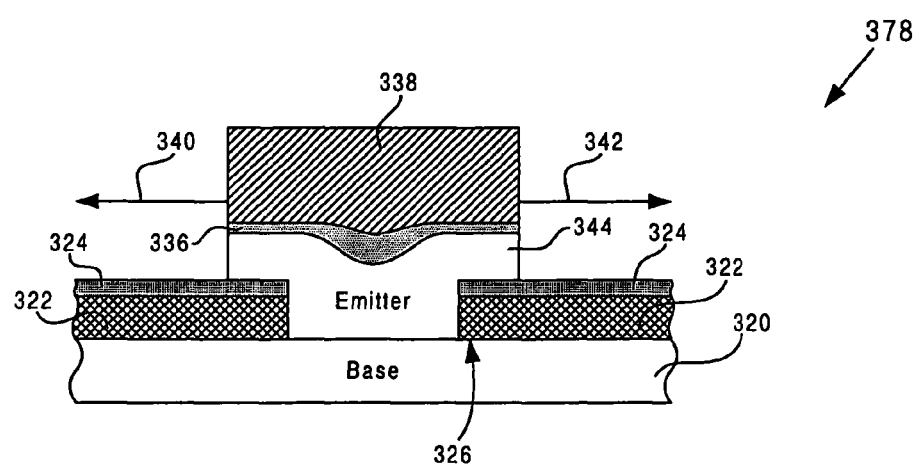
FIG. 3F illustrates a cross-sectional view, which includes a portion of a wafer processed according to an embodiment of the invention, corresponding to step 278 of the flowchart of FIG. 2.

Continuing with step 278 in FIG. 2 and structure 378 in FIG. 3F, at step 278 of flowchart 200, mask 338 is formed and patterned on BARC layer 336 so that emitter 344 can be patterned by removing portions of BARC layer 336 and emitter layer 334 situated in regions 340 and 342, which are not protected by mask 338. It is noted that portions of BARC layer 336, emitter layer 334, ARC layer 324, and base oxide layer 322 situated in regions 340 and 342 are also referred to as "unmasked" portions in the present application. Mask 338 can be formed in a manner known in the art and can comprise photoresist or other suitable masking material. Unmasked portions of BARC layer 336 may be removed by using, for example, a plasma etch process. After removal of unmasked portions BARC layer 336, unmasked portions of emitter layer 334 may be removed to form emitter 344 by using, for example, a plasma etch process that is selective to ARC layer 324. Referring to FIG. 3F, the result of step 278 of flowchart 200 is illustrated by structure 378.

Figure 3G:
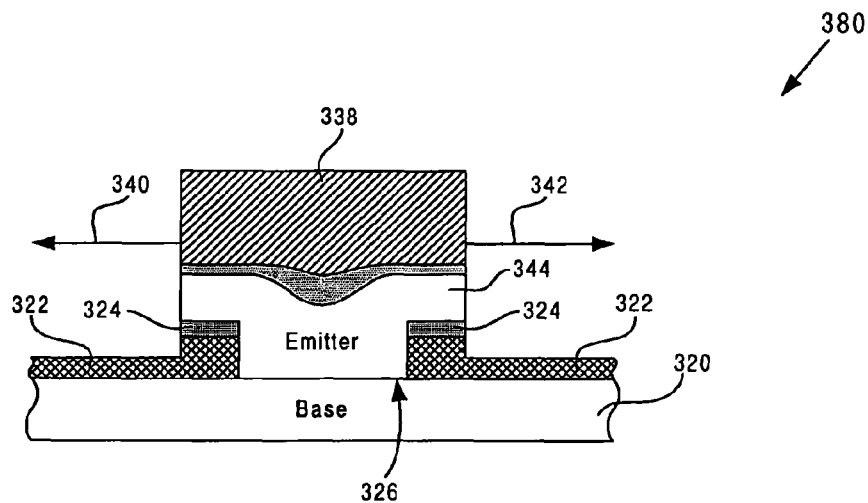
FIG. 3G illustrates a cross-sectional view, which includes a portion of a wafer processed according to an embodiment of the invention, corresponding to step 280 of the flowchart of FIG. 2.

Continuing with step 280 in FIG. 2 and structure 380 in FIG. 3G, at step 280 of flowchart 200, unmasked portions of ARC layer 324 are removed and unmasked portions of base oxide layer 322 are partially removed. The unmasked portions of ARC layer 324 can be removed using a plasma etch process, for example, which has a sufficient degree of selectivity to base oxide so as to stop on base oxide layer 322. After entirely removing unmasked portions of ARC layer 324, the plasma etch process is continued so as to partially remove unmasked portions of base oxide layer 322. In other words, ARC layer 324 is "overetched" so as to cause unmasked portions of base oxide layer 322 to be reduced in thickness. By way of example, a sufficient amount of base oxide can be removed by the overetch of ARC layer 324 so as to reduce the thickness of remaining unmasked portions of base oxide layer 322 to between approximately 400.0 Angstroms and approximately 500.0 Angstroms. In the present invention, the amount of overetch of ARC layer 324 discussed above is determined to achieve effective removal of "polysilicon stringers" that form in the CMOS region of the silicon substrate, while allowing a sufficient thickness of base oxide layer 322 to remain over base 320 to prevent "pitting" from occurring in polysilicon portions of the CMOS region. As such, by optimizing the amount of overetch of ARC layer 324, the present invention advantageously achieves a reduction in defects caused by pitting in the CMOS region of the substrate, thus resulting in increased manufacturability and reduced manufacturing cost. Referring to FIG. 3G, the result of step 280 of flowchart 200 is illustrated by structure 380.

Figure 3H:
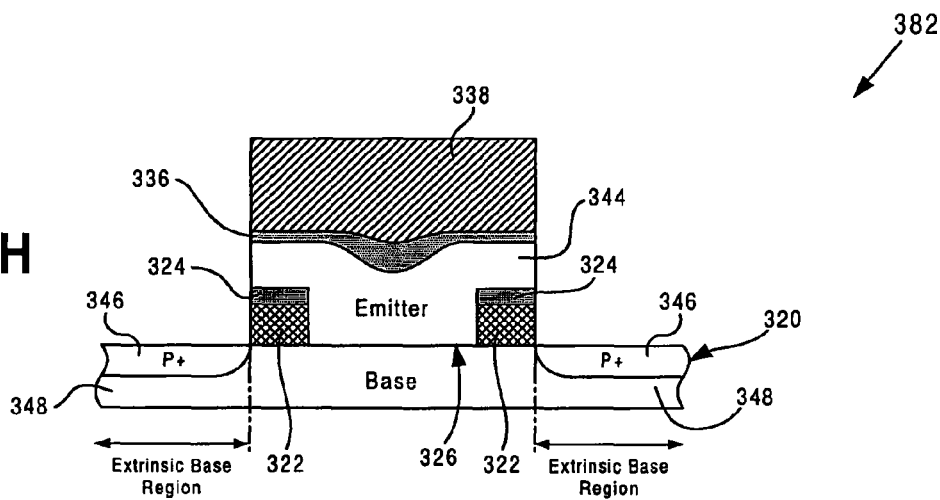
FIG. 3H illustrates a cross-sectional view, which includes a portion of a wafer processed according to an embodiment of the invention, corresponding to step 282 of the flowchart of FIG. 2.

Continuing with step 282 in FIG. 2 and structure 382 in FIG. 3H, at step 282 of flowchart 200, remaining unmasked portions of base oxide layer 322 are removed and a base implant is performed in extrinsic base regions 348 of base 320. Unmasked portions of base oxide layer 322 can be removed, for example, using a wet etch, such as a wet BOE etch comprising an HF+NH4F chemistry. After removal of remaining unmasked portions of base oxide layer 322, an extrinsic base implant can be performed in extrinsic base regions 348 of base 320 to form heavily doped P+ implanted regions 346. In one embodiment, the dopant used to form implanted regions 346 can be boron. However, in another embodiment, a different dopant can be used to form implanted regions 346. Referring to FIG. 3H, the result of step 282 of flowchart 200 is illustrated by structure 382.

Figure 3I:
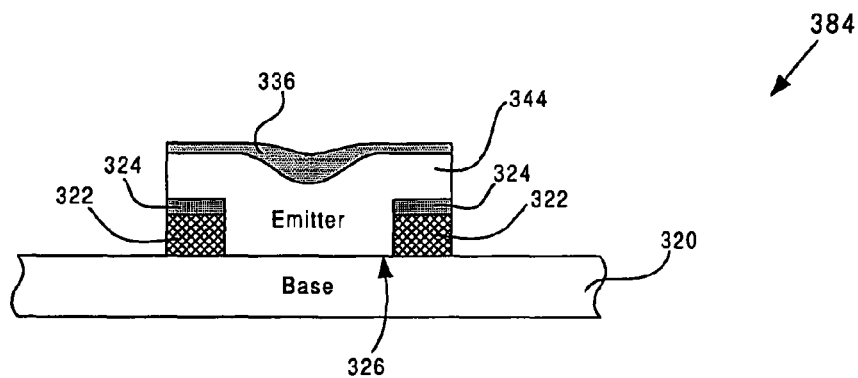
FIG. 3I illustrates a cross-sectional view, which includes a portion of a wafer processed according to an embodiment of the invention, corresponding to step 284 of the flowchart of FIG. 2.

Continuing with step 284 in FIG. 2 and structure 384 in FIG. 3I, at step 284 of flowchart 200, mask 338 situated over emitter 344 on BARC layer 336 is removed. Mask 338 may be removed by stripping mask 338 using, for example, a plasma etch process or other appropriate process. Subsequent steps of forming contacts, as well as other steps, can be performed as known in the art. Referring to FIG. 3I, the result of step 284 of flowchart 200 is illustrated by structure 384.

As explained above, the present invention achieves an emitter window stack that requires fewer processing steps compared to an emitter window stack present in the known "poly process flow" discussed above, which requires a poly layer in addition to an ARC layer and a base oxide layer. Thus, by reducing processing steps by eliminating a poly layer, the present invention advantageously achieves a reduced processing cost compared to known poly process flows. Moreover, by eliminating the need for a polysilicon layer utilized in known poly process flows, the present invention advantageously achieves a simplified process flow for fabricating a bipolar transistor in a BiCMOS process. As is known in the art, fabrication of a polysilicon layer causes a bottleneck in a typical fabrication process, since fabrication of the polysilicon layer consumes a significant amount of processing time. Thus, by reducing the number of process steps and eliminating the polysilicon layer in the emitter window stack, the present invention advantageously achieves a process flow for fabricating a bipolar transistor in a BiCMOS process at a reduced manufacturing cost and higher throughput. Also, by eliminating the polysilicon layer and, consequently, reducing the number of process steps, the present invention advantageously achieves an integration process that provides improved manufacturing yield and reduced defects that are otherwise caused by pitting and poly stringers in CMOS regions of the substrate.

From the description of the above invention it is evident that various techniques can be used for implementing the concepts of the present invention without departing from its scope and spirit. Moreover, while the invention has been described with specific reference to certain embodiments, a person of ordinary skills in the art would-recognize that changes made in form and detail without departing from the spirit and scope of the invention. The described embodiments are to be considered in all respects as illustrative and not restrictive. Therefore, it should be understood that the invention is not limited to the particular embodiments described herein, but is capable of many rearrangements, modifications, and substitutions without departing from the scope of the invention.

Thus, method for fabricating a bipolar transistor in a BiCMOS process and related structure have been described.

The invention claimed is:

1. A bipolar transistor comprising:
a base having a top surface and extrinsic base regions, said extrinsic base regions including a heavily doped implanted region;
an emitter window stack situated between said extrinsic base regions,
the emitter window stack comprising only a base oxide layer situated on said top surface of said base and an antireflective coating layer situated on and in contact with said base oxide layer;
an emitter situated over said top surface of said base, wherein said emitter is situated between said extrinsic base regions of said base, wherein said emitter is situated over and in direct contact with a top surface of the emitter window stack and said emitter is situated over and in direct contact with side surfaces of the emitter window stack;
a collector situated below said base and said heavily doped implanted region;
a buried layer underlying and in contact with said collector, said buried layer having a same conductivity type as said collector; a collector sinker situated above and in contact with said buried layer, said collector sinker being electrically connected to said collector by said buried layer;
wherein said bipolar transistor has reduced process steps.

2. The bipolar transistor of claim 1 wherein said base oxide layer comprises undoped silicate glass oxide.

3. The bipolar transistor of claim 1 wherein said emitter comprises polycrystalline silicon.

4. The bipolar transistor of claim 1 wherein said bipolar transistor is an NPN silicon-germanium heterojunction bipolar transistor.

5. A bipolar transistor comprising:
a base having a top surface and extrinsic base regions, said extrinsic base regions including a heavily doped implanted region;
an emitter window stack situated between said extrinsic base regions,
the emitter window stack comprising only a base oxide layer situated on said top surface of said base and an antireflective coating layer situated on and in contact with said base oxide layer;
an emitter situated over said top surface of said base and situated between said extrinsic base regions of said base, wherein said emitter is situated over and in direct contact with a to surface of the emitter window stack and said emitter is situated over and in direct contact with side surfaces of the emitter window stack;
a collector situated below said base and said heavily doped implanted region;
a buried layer underlying and in direct contact with said collector, said buried layer having a same conductivity type as said collector;
a collector sinker situated above and in direct contact with said buried layer, said collector sinker being electrically connected to said collector by said buried layer;
wherein said bipolar transistor has reduced process steps.

6. The bipolar transistor of claim 5 wherein said base oxide layer comprises undoped silicate glass oxide.

7. The bipolar transistor of claim 5 wherein said emitter comprises polycrystalline silicon.

8. The bipolar transistor of claim 5 wherein said bipolar transistor is an NPN silicon-germanium heterojunction bipolar transistor.

9. The bipolar transistor of claim 5 wherein said base oxide layer is thicker than said antireflective coating layer.

10. The bipolar transistor of claim 9 wherein said base oxide layer is more than twice as thick as said antireflective coating layer.

* * * * *